(12) United States Patent
Maruyama (10) Patent No.: US 9,837,938 B2
(45) Date of Patent: Dec. 5, 2017

(54) VIBRATION ELEMENT, METHOD FOR MANUFACTURING SAME, AND VIBRATION-TYPE DRIVING DEVICE

(71) Applicant: CANON KABUSHIKI KAISHA, Tokyo (JP)

(72) Inventor: Yutaka Maruyama, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 631 days.

(21) Appl. No.: 14/175,448

(22) Filed: Feb. 7, 2014

(65) Prior Publication Data

US 2014/0225479 A1   Aug. 14, 2014

(30) Foreign Application Priority Data

Feb. 8, 2013   (JP) ................... 2013-023670

(51) Int. Cl.
*H01L 41/08* (2006.01)
*H02N 2/00* (2006.01)
*H01L 41/047* (2006.01)
*H01L 41/187* (2006.01)
*H01L 41/314* (2013.01)
(Continued)

(52) U.S. Cl.
CPC ........... *H02N 2/22* (2013.01); *H01L 41/0477* (2013.01); *H01L 41/0815* (2013.01); *H01L 41/1876* (2013.01); *H01L 41/314* (2013.01); *H02N 2/002* (2013.01); *H02N 2/0015* (2013.01);
(Continued)

(58) Field of Classification Search
CPC ............. H01L 14/0477; H01L 14/0815; H01L 14/1876; H02N 2/022

USPC ......... 310/366, 323.02, 328, 323.12, 323.16, 310/323.06, 323.03, 365, 323.01, 323.11, 310/359, 363, 311, 323.04, 323.08, 334, 310/358, 369, 323.05, 323.13, 323.15, 310/325, 326, 331, 348, 357, 364; 29/25.35, 846, 830, 852, 419.1, 527.3, 29/527.6, 594, 829

See application file for complete search history.

(56) References Cited

U.S. PATENT DOCUMENTS

2007/0080317 A1* 4/2007 Iezumi ................. C04B 35/493
                                                        252/62.9 PZ
2011/0025168 A1* 2/2011 Maruyama .......... H01L 41/0906
                                                          310/323.06

(Continued)

FOREIGN PATENT DOCUMENTS

JP            2842448 B2    1/1999
JP         2004200382 A     7/2004
(Continued)

*Primary Examiner* — Thomas Dougherty
*Assistant Examiner* — Karen B Addison
(74) *Attorney, Agent, or Firm* — Canon U.S.A., Inc. IP Division (57) ABSTRACT

An aspect of the present invention relates to a vibration element comprising: a substrate; a ceramic layer containing glass and provided on the substrate; and a piezoelectric element comprising an electrode layer fixed to the substrate with the ceramic layer therebetween and a piezoelectric layer, wherein the piezoelectric layer, the electrode layer, the substrate, and the ceramic layer are integrated by the piezoelectric layer, the electrode layer, the substrate, and the ceramic layer being sintered together at a sintering temperature of from 800° C. or higher to 940° C. or lower.

15 Claims, 7 Drawing Sheets

(51) Int. Cl.
*H02N 2/02* (2006.01)
*H02N 2/10* (2006.01)

(52) U.S. Cl.
CPC ............ *H02N 2/026* (2013.01); *H02N 2/103* (2013.01); *Y10T 29/42* (2015.01)

(56) References Cited

U.S. PATENT DOCUMENTS

2011/0291525 A1   12/2011   Maruyama
2012/0153774 A1    6/2012   Maruyama

FOREIGN PATENT DOCUMENTS

| JP | 2004304887 A | 10/2004 |
| JP | 2009124791 A |  6/2009 |
| JP | 2011029537 A |  2/2011 |
| JP | 2011217493 A | 10/2011 |
| JP | 2011254569 A | 12/2011 |
| JP | 2012015758 A |  1/2012 |
| JP | 2012020918 A |  2/2012 |

\* cited by examiner

VIBRATION ELEMENT, METHOD FOR MANUFACTURING SAME, AND VIBRATION-TYPE DRIVING DEVICE

BACKGROUND OF THE INVENTION

Field of the Invention

The present invention relates to a vibration element, a method for manufacturing the same, and a vibration-type driving device, and in particular to a vibration element having a substrate and a piezoelectric element fixed thereon, a method for manufacturing the same, and a vibration-type driving device including the vibration element.

Description of the Related Art

In related art, a vibration-type driving device (a vibration wave actuator, for example) typically includes a piezoelectric element that functions as a vibration source of a vibration element (also referred to as a vibrator). Examples of the piezoelectric element include a single plate-like piezoelectric element and a more recent multi-layer piezoelectric element having multiple piezoelectric layers and electrode layers stacked alternately as taught in Japanese Patent Application Laid-Open No. 2004-304887.

Figure 7:
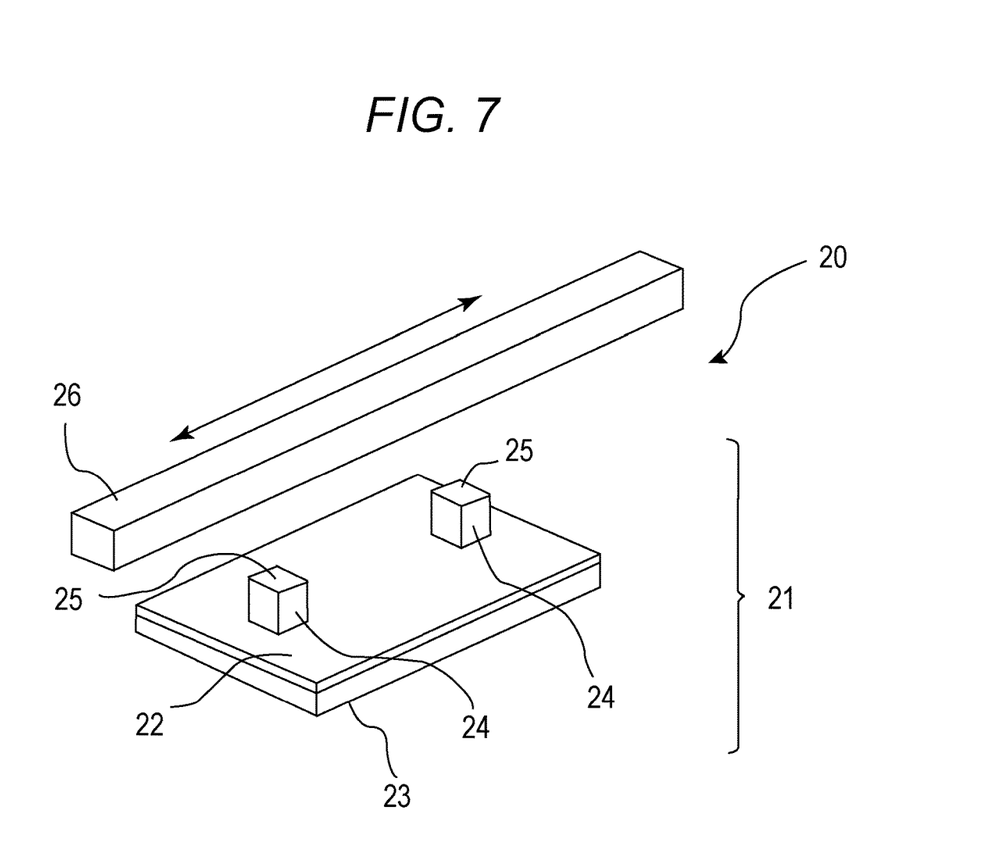
FIG. 7 is a diagram for explaining a linear, vibration-type driving device.

FIG. 7 is an outline perspective view of a linear, vibration-type driving device 20 (an ultrasonic actuator) according to Japanese Patent Application Laid-Open No. 2004-304887.

The linear, vibration-type driving device 20 includes a vibration element 21 and a linear slider 26 that is a driven element in pressure contact therewith.

The vibration element 21 has a multi-layer piezoelectric element 23 and a vibration plate 22. The multi-layer piezoelectric element 23 has piezoelectric layers and electrode layers bonded alternately with an adhesive.

The vibration plate 22 made of metal has a plate portion formed into a rectangular shape and two protruding portions 24 each formed into a protrusive shape on the top surface of the plate portion. The protruding portions 24 each have a contact portion 25 on the top surface thereof. The contact (friction) portions 25, which are members brought into direct contact with the linear slider 26 that is a driven element, are made of alumina (aluminum oxide) that is abrasion resistant ceramics.

The shape of the vibration element 21 of the linear, vibration-type actuator 20 is determined so that the resonance frequencies in two flexural vibration modes, which are a primary flexural vibration mode in the long-axis direction and a secondary flexural vibration mode in the short-axis direction, approximately coincide with each other. Input of predetermined high-frequency voltages having phases different from each other by approximately $\pi/2$ causes the vibration element 21 to be excited, which excites circular movement or elliptical movement of the protruding portions 24.

The circular movement or elliptical movement generates a force to move the linear slider 26 in pressure contact with the vibration element 21 relative to the vibration element 21 with the frictional force. The relative movement force allows the linear slider 26 to be driven in a linear reciprocating manner in the direction shown by the arrow.

Such a multi-layer piezoelectric element 23 can be produced as follows. First, green sheets to be piezoelectric layers are formed from a piezoelectric powder material and an organic binder by such a method as the doctor blade method, and an electrode paste material is printed on predetermined positions on the green sheets to produce electrode layers.

Subsequently, a predetermined number of such green sheets are stacked in a planar state and pressurized to form a laminate. Thereafter, the piezoelectric layers and the electrode layers are integrated by being sintered together, then subjected to poling, and finally subjected to machining to be finished into a predetermined size.

Furthermore, Japanese Patent No. 2842448 proposes a piezoelectric/electroresistive actuator having an integrated multilayered structure formed by sequentially stacking an electrode material and a piezoelectric material into a laminate on at least one surface of a substrate and integrating the stacked materials by heat treatment.

Moreover, Japanese Patent Application Laid-Open No. 2011-254569 proposes a vibration element in which a piezoelectric element having piezoelectric layers and electrode layers is fixed onto a substrate and which causes the substrate to vibrate by vibration energy of the piezoelectric element.

The vibration element includes a bonding layer that is a ceramic layer containing glass powder between the piezoelectric element and the substrate. The piezoelectric element is fixed to the substrate with the bonding layer therebetween by sintering.

In the vibration element 21 of the vibration-type driving device of the related art illustrated in FIG. 7 described above, the multi-layer piezoelectric element 23 and the vibration plate (hereinafter referred to as a substrate) 22 made of metal are bonded with a resin adhesive. The resin adhesive, however, is softer than the piezoelectric element and the metal, which makes the vibration damping of the vibration element larger and, particularly when the temperature of the resin is higher, lowers the efficiency of the vibration-type driving device.

Furthermore, as the vibration-type driving device is made smaller, influences of the variation in the thickness of the bonding layer of the adhesive and of the positional accuracy of the bonding on the performance of the small vibration-type driving device become larger and the variation in the performance of the small vibration-type driving device thus becomes larger.

Moreover, the method for manufacturing multi-layer piezoelectric elements of the related art requires a high amount of equipment investment for such manufacturing equipment as a machine for forming green sheets from the piezoelectric powder material, a laminating press, and a processing machine, which contributes to an increase in the manufacturing cost.

An attempt is thus made to directly fix (bond) the multi-layer piezoelectric element onto the substrate without providing a bonding layer of an adhesive simultaneously with production of the multi-layer piezoelectric element as taught in Japanese Patent No. 2842448 of the related art mentioned above.

The ceramic substrate and the electrode layers made of noble metal, however, are less chemically reactive and lower in bonding strength. The piezoelectric element thus has such problems that the piezoelectric element is likely to be separated from the ceramic substrate during sintering and is also separated by vibration of the actuator.

A vibration element produced as follows as taught in Japanese Patent Application No. 2011-254569 of the related art mentioned above is thus proposed. The vibration element is produced by providing the bonding layer containing glass powder between the piezoelectric element and the ceramic substrate, sintering the piezoelectric element and the substrate together, and melting the glass powder to bond the piezoelectric element and the substrate to each other. With such a structure, however, there still are problems that separation and cracks are caused near the boundary between the bonding layer and the piezoelectric element and that the expected performance of the vibration element cannot be provided. Furthermore, owing to high sintering temperatures, it is difficult to use 100% by weight of silver as an electrode material.

SUMMARY OF THE INVENTION

An aspect of the present invention relates to a vibration element capable of suppressing vibration damping due to a structure at a lower cost and with a smaller size, lowering vibration energy loss due to vibration damping, and efficiently outputting vibration energy, a method for manufacturing the vibration element, or a vibration-type driving device. In addition, an aspect of the present invention relates to a vibration element in which a material having a relatively low melting point such as 100% by weight of silver as can be used an electrode material, a method for manufacturing the vibration element, or a vibration-type driving device. Note that 100% by weight of silver mentioned herein includes not only pure silver but also silver containing an amount of impurities that is inevitably contained during manufacture.

An aspect of the present invention relates to a vibration element including: a substrate; a ceramic layer containing glass and provided on the substrate; and a piezoelectric element comprising an electrode layer fixed to the substrate with the ceramic layer therebetween and a piezoelectric layer, wherein the piezoelectric layer, the electrode layer, the substrate, and the ceramic layer are integrated by the piezoelectric layer, the electrode layer, the substrate, and the ceramic layer being sintered together at a sintering temperature of from 800° C. or higher to 940° C. or lower.

Another aspect of the present invention relates to a vibration element including: a substrate; a ceramic layer containing glass and provided on the substrate; and a piezoelectric element comprising an electrode layer fixed to the substrate with the ceramic layer therebetween and a piezoelectric layer, wherein the piezoelectric layer comprises a piezoelectric material containing 0.5% by weight or less of copper oxide.

Another aspect of the present invention relates to a method for manufacturing a vibration element, including: forming a ceramic layer containing glass on a substrate; stacking a piezoelectric element comprising an electrode layer and a piezoelectric layer containing a piezoelectric material on the ceramic layer; and sintering the electrode layer, the piezoelectric layer, the substrate, and the ceramic layer together at a sintering temperature of from 800° C. or higher to 940° C. or lower.

Further features of the present invention will become apparent from the following description of exemplary embodiments (with reference to the attached drawings).

DESCRIPTION OF THE EMBODIMENTS

Modes in which the present invention is carried out will be described by way of the following embodiments.

EMBODIMENTS

First Embodiment

An example of a vibration element according to a first embodiment will be described with reference to FIGS. 1A to 1C. Specifically, a vibration element 1a of the present embodiment is a vibration element configured to generate longitudinal vibration and to be applied to a vibration-type driving device. FIG. 1B illustrates a cross section taken along a center line (an alternate long and short dash line) shown in FIG. 1C.

The vibration element 1a of the present embodiment includes a substrate 2a and a piezoelectric element 3a having a piezoelectric layer and electrode layers and bonded to the substrate 2a, and is configured to cause the substrate 2a to vibrate by vibration energy of the piezoelectric element 3a and output vibration energy of the vibration element 1a.

The vibration element 1a has the plate-like substrate 2a and the piezoelectric element 3a, and is provided with a ceramic layer 4a containing molten glass that is glass powder molten by sintering between the substrate 2a and the piezoelectric element 3a. The piezoelectric element 3a includes an electrode layer 5a, a piezoelectric layer 6a, and an electrode layer 7a that are stacked in this order. The electrode layer 5a and the electrode layer 7a are opposed to each other with the piezoelectric layer 6a therebetween.

As will be described later, the vibration element 1a is subjected to simultaneous sintering of the ceramic layer 4a on the substrate 2a, and the electrode layer 5a, the piezoelectric layer 6a, and the electrode layer 7a constituting the piezoelectric element 3a together. As a result, the piezoelectric element 3a is sintered and also bonded to and integrated with the substrate 2a with the ceramic layer 4a therebetween that is a bonding layer.

Specifically, the piezoelectric element 3a that is a vibration energy source and the substrate 2a that is a vibration plate vibrated by the vibration energy of the piezoelectric element 3a are bonded to each other with the ceramic layer 4a for bonding and integrated as the vibration element 1a.

Furthermore, electrical continuity with an external power source is achieved by bonding two conductive wires 8 to the electrode layers 5a and 7a with a conductive paste or solder.

Figure 1A:
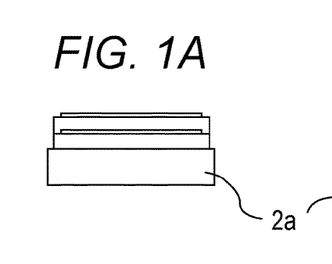
FIGS. 1A, 1B, and 1C are a front view, a side view, and a plan view, respectively, explaining an example structure of a vibration element.
Figure 1B:
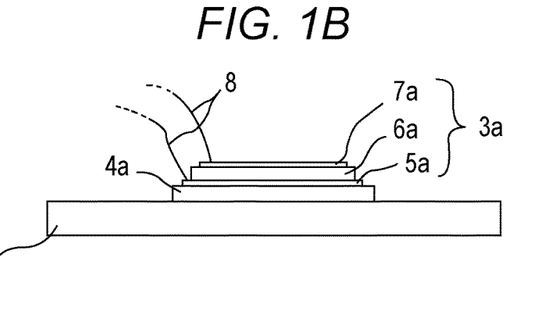
Figure 1C:
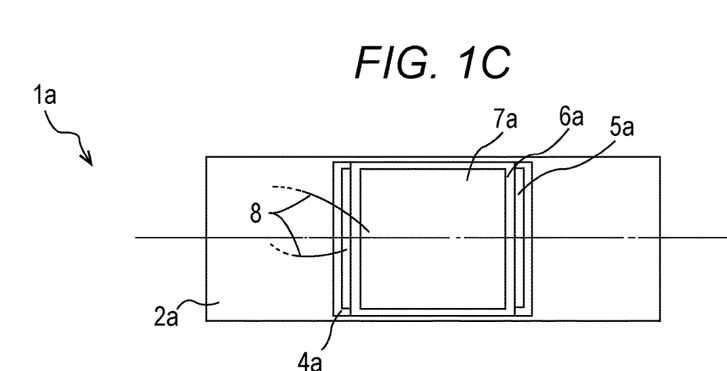

As illustrated in FIGS. 1A to 1C, the piezoelectric element 3a is positioned at the center of the substrate 2a. The substrate 2a has a length of 25 mm, a width of 10 mm, and a thickness of 0.25 mm. The ceramic layer 4a has a length of 11 mm, a breadth of 8.5 mm, and a thickness of 10 μm. The piezoelectric layer 6a has a length of 9 mm, a breadth of 8.5 mm, and a thickness of 10 μm.

The electrode layer 7a has a length and a breadth of 8 mm, and a thickness of 2 to 3 μm that is a thickness of an electrode layer of a typical multi-layer piezoelectric element.

Furthermore, the electrode layer 5a has a length of 10 mm, a breadth of 8 mm, and a thickness of 5 μm. The tolerance of the thickness of the layers is made as small as possible but is about ±2 μm.

the vibration element 1a in which the piezoelectric element 3a is integrated with the substrate 2a with the ceramic layer 4a therebetween is subjected to poling, which will be described later.

When a high-frequency voltage is supplied to the electrode layers 5a and 7a from the external power source for controlling vibration of the piezoelectric element 3a, a piezoelectric active portion (a portion of the piezoelectric layer that is subjected to poling and exhibits piezoelectricity) of the piezoelectric layer 6a stretches (is distorted).

As a result, and the stretching causes the substrate 2a to stretch together and is output as vibration energy from the vibration element 1a.

For example, application of a voltage at a certain frequency to the electrode layers 5a and 7a can cause longitudinal vibration according to the frequency. The longitudinal vibration can be utilized so that the vibration element 1a can be used as a vibration element of an actuator as in FIG. 2.

Figure 2:
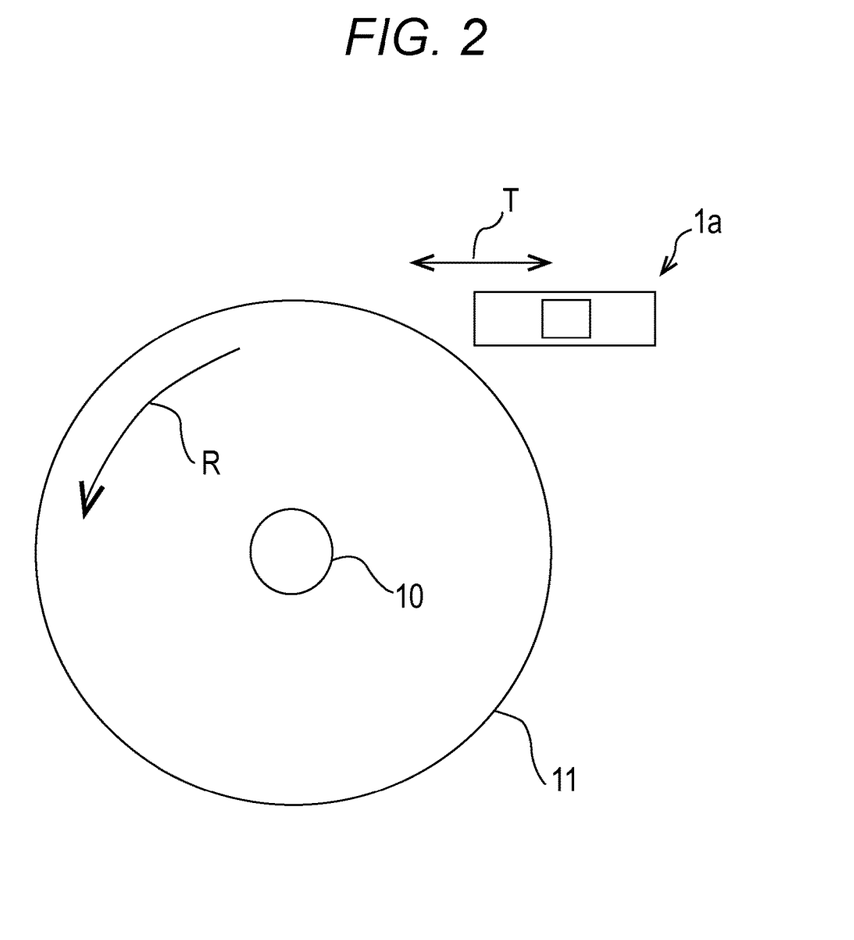
FIG. 2 is a diagram illustrating a vibration-type driving device in which the vibration element according to a first embodiment of the present invention is integrated.

FIG. 2 illustrates a vibration-type driving device including the vibration element 1a, in which the vibration element 1a according to the present invention is used as a driving power source to rotate a disc 11 having a rotation axis 10.

In FIG. 2, when the vibration element 1a is caused to generate longitudinal vibration in the direction of an arrow T and positioned so that a corner of the vibration element 1a is in contact with the surface of the disc 11, the disc 11 can be rotated in the direction of an arrow R.

Figure 3:
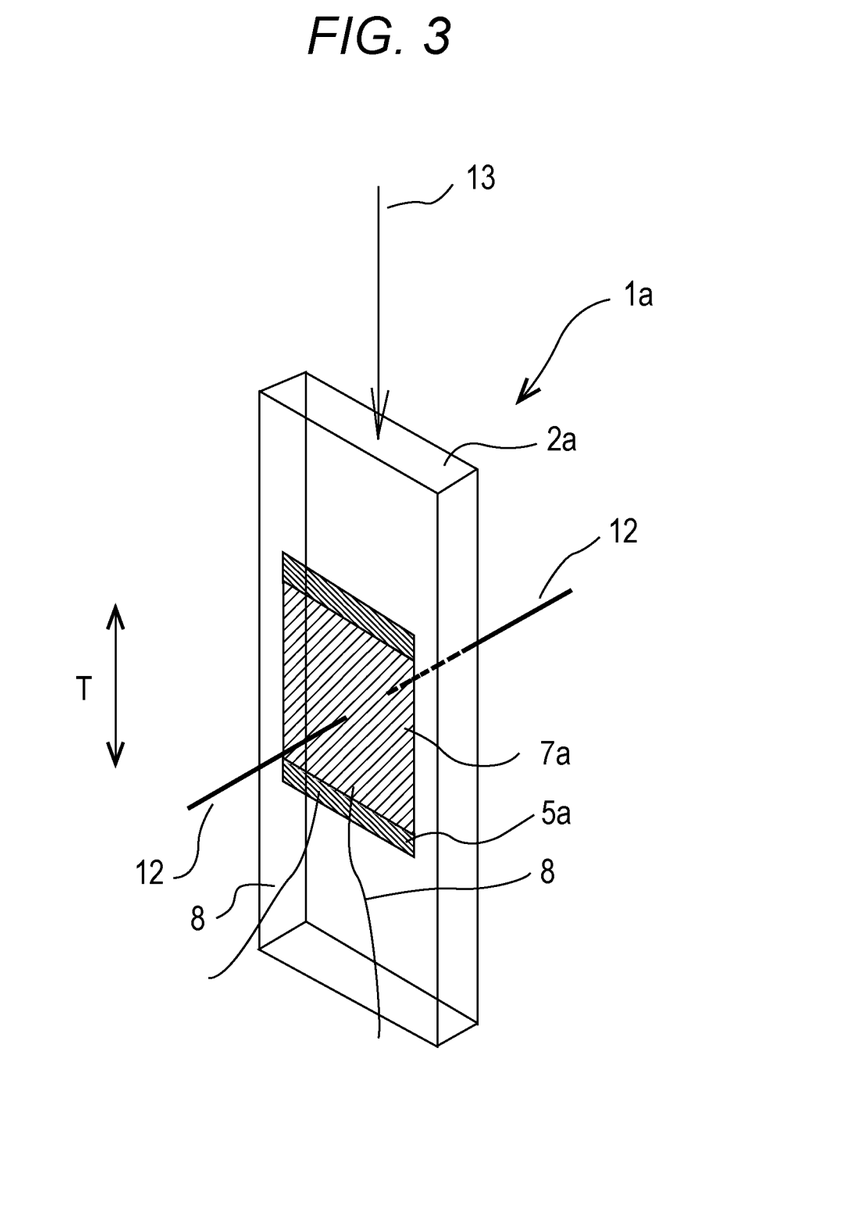
FIG. 3 is a diagram explaining a method for evaluating the performance of the vibration element and illustrating a supporting method during voltage application to the vibration element.

FIG. 3 illustrates a method for evaluating a vibration element in which a center portion of the vibration element 1a is held between two contact pins 12 and the vibration velocity of the longitudinal vibration (in the direction of the arrow T) of the vibration element 1a is measured with laser light 13 from a laser Doppler velocimeter.

In the vibration element 1a, a high-frequency voltage V is applied via the conductive wires 8 conducted to the electrode layers 5a and 7a, and the frequency of the high-frequency voltage V is swept from a frequency larger than a resonance frequency (approximately 190 KHz) of the longitudinal vibration to a smaller frequency.

A vibration velocity v at which the longitudinal vibration at resonance is maximum is then measured, and evaluated as the vibration characteristics (vibration performance) of the vibration element 1a.

Next, a method for producing the vibration element 1a will be described.

First, in FIGS. 1A to 1C, sintered plate-like ceramics is subjected to grinding and cutting to be finished into a predetermined size as the substrate 2a.

Subsequently, a ceramic powder paste made by mixing ceramic powder, glass powder to be described later, an organic solvent, and an organic vehicle made of an organic binder and capable of forming a thick film is printed to coat one surface of the substrate 2a by the screen printing method.

The coating ceramic powder paste in which glass powder is mixed is heated at approximately 150° C. for about 10 minutes so that the organic solvent is removed therefrom and the paste is dried to form the ceramic layer 4a.

Note that the surface of the substrate 2a of ceramics forming the ceramic layer 4a is preferably a smooth surface having a surface roughness (Japanese Industrial Standards: JIS B0601-2001) Rz of 2 μm or smaller in ten-point average roughness (JIS B0601-2001).

This is because the surface roughness of the ceramic layer 4a also becomes larger than 1 μm if the surface roughness Rz of the substrate 2a is larger than 2 μm, which is one cause of preventing the electrode layer 5a from being formed to be flat.

Subsequently, the electrode layer 5a is formed on the ceramic layer as follows. A conductive material powder paste made by mixing conductive material powder in which piezoelectric powder is mixed in advance, an organic solvent, and an organic vehicle made of an organic binder is coated onto the ceramic layer 4a by the screen printing method, heated at approximately 150° C. for about 10 minutes and dried to form the electrode layer 5a.

Furthermore, a piezoelectric material powder paste made by mixing piezoelectric material powder, an organic solvent, and an organic vehicle made of an organic binder and capable of forming a thick film is printed to coat a surface of the electrode layer 5a by the screen printing method. Note that the thicknesses of the electrode layers including the electrode layer 5a, the piezoelectric layer, and the ceramic layer can be changed by changing the mesh thickness and the opening ratio of the plate for screen printing and the printing conditions.

Subsequently, the coated piezoelectric material powder paste is heated at approximately 150° C. for about 10 minutes so that the organic solvent is removed and the paste is dried to form the piezoelectric layer 6a. Subsequently, similarly to the electrode layer 5a, the conductive material powder paste is coated onto the piezoelectric layer 6a by the screen printing method and dried to form the electrode layer 7a.

As described above, coating and drying are sequentially repeated to form the ceramic layer 4a, the electrode layer 5a, the piezoelectric layer 6a, and the electrode layer 7a onto the substrate 2a.

The thus formed ceramic layer 4a on the substrate 2a, and the thus formed piezoelectric element 3a including the electrode layer 5a, the piezoelectric layer 6a, and the electrode layer 7a that are stacked are in an unsintered state in which the layers are not bonded to one another.

Thus, the piezoelectric element 3a is heated from room temperature to 500° C. by using an electric furnace to remove the organic binder, and then sintered at a certain sintering temperature (the sintering temperature herein refers to a maximum temperature during sintering) in a lead atmosphere for two hours. The sintering temperature will be described later in detail.

Specifically, the electrode layer 5a, the piezoelectric layer 6a, the electrode layer 7a, the substrate 2a, and the ceramic layer 4a in the unsintered state are sintered simultaneously to produce the piezoelectric element through sintering and bond (integrate) the piezoelectric element 3a to the ceramic layer 4a and the substrate 2a at the same time.

Thereafter, the conductive wires 8 are fixed and conducted to the electrode layers 5a and 7a with a conductive paste or solder, a voltage is applied across the electrode layers 5a and 7a via the conductive wires 8, and the piezoelectric layer 6a is subjected to poling.

The conditions for poling are that a predetermined DC voltage (corresponding to approximately 1 V/μm per thickness of the piezoelectric layer 6a) is applied across the electrode layer 5a being grounded (G) and the electrode layer 7a being positive (+) on a hot plate heated to a high temperature of 170 to 200° C., and poling is performed for about 30 minutes.

The piezoelectric active portion of the piezoelectric layer 6a that is actually subjected to poling and exhibits activity of the piezoelectricity is a portion between the two electrode layers 5a and 7a opposed to each other with the piezoelectric layer 6a therebetween and across which the voltage is applied during poling.

The portion subjected to poling is a portion that can cause displacement as the piezoelectric active portion, and the piezoelectric property of the piezoelectric active portion in the piezoelectric layer relates directly to the vibration characteristics of the vibration plate and the performance of the vibration-type driving device.

The material for the substrate 2a is preferably alumina (aluminum oxide) that is easily-available and inexpensive sintered ceramics and that is a material with smaller vibration damping than metal (a material for a vibration element with smaller energy loss).

As the purity of alumina is lowered, the mechanical strength thereof is lowered and the vibration damping of the vibration element is larger. Thus, the substrate 2a is more preferably formed of highly-pure alumina with a purity of 99.5% by weight or higher and 99.99% by weight or lower. Furthermore, alumina is also suitable for contact (friction) portions of the vibration element 1a of the vibration-type driving device since alumina is hard and excellent in abrasion resistance. The material for the substrate 2a may be any material that is stably bonded to the ceramic layer 4a in which glass powder is mixed in advance.

For the substrate, general ceramics such as zirconia, silicon carbide, aluminum nitride or silicon nitride other than alumina can be used. Since glass powder is mixed in advance in the ceramic layer 4a, the glass component molten by sintering can enhance the adhesion strength with the substrate 2 and the electrode layer 5a, allowing bonding thereto.

In the present embodiment, the ceramic layer 4a that is a bonding layer for bonding can be formed by using a ceramic powder paste made from ceramic powder containing the same piezoelectric powder as the piezoelectric layer 6a and glass powder added thereto.

The ceramic powder for the ceramic layer 4a, however, may be any ceramics that is sintered at the sintering temperature of the piezoelectric element and has a mechanical strength effective to bonding of the substrate and the piezoelectric element. For example, ceramic powder of the same material as the substrate (powder mainly containing alumina in the present example) has a good compatibility with the substrate and is thus preferable. The glass powder contains silicon oxide and boron oxide, and may be additionally mixed with bismuth oxide, alumina, alkali metal oxide, and alkali earth metal oxide. Glass powder (also referred to as a glass frit) that is melted once and finely ground to have an average particle size of 1 to 2 μm can be used.

About 0.2 to 10% by weight of the glass powder is added to the piezoelectric material powder and made into a paste. The softening point of the glass can be changed depending on the sintering temperature of the piezoelectric ceramics by changing the content ratio of silicon oxide and boron oxide.

Furthermore, chemical reaction can be enhanced depending on the material of the substrate by selecting the additional element to increase the bonding strength.

The glass powder contained in the ceramic layer 4a is softened, molten and fluidized when sintered. Since a relatively large amount of molten glass resulting from melting the glass powder flows to the boundary with the substrate 2a, chemically reacts with and is tightly bound to the substrate 2a.

An amount of glass powder smaller than 0.5% by weight of the weight of the ceramic powder produces little effect of bonding to the substrate 2a. On the other hand, an amount of glass powder larger than 10% by weight results in high diffusion of molten glass component into the substrate 2a, degrades the mechanical properties of the substrate 2a, and also degrades the mechanical properties of the ceramic layer 4a itself, which are disadvantages of glass powder.

In view of the above, the amount of glass powder is preferably 0.5% by weight or larger and 10% by weight or smaller of the weight of ceramic powder of the ceramic layer 4a.

An advantage of using glass powder for the ceramic layer for bonding is that the chemical composition of the glass powder can be easily adjusted depending on the sintering temperature and the mechanical strength. Glass powder can thus be applied to substrates of various materials.

As described above, the vibration element 1a is formed through simultaneous sintering of the ceramic layer 4a on the substrate 2a and the electrode layer 5a, the piezoelectric layer 6a, and the electrode layer 7a constituting the piezoelectric element 3a together. As a result, the piezoelectric element 3a is sintered and, at the same time, the piezoelectric element 3a bonded to and integrated with the substrate 2a with the ceramic layer 4a that is the bonding layer therebetween. In other words, the piezoelectric element 3a and the substrate 2a are bonded at the sintering temperature of the piezoelectric element 3a. The piezoelectric material used herein is ternary or multicomponent piezoelectric material powder containing as main components lead zirconate and lead titanate ($PbZrO_3$—$PbTiO_3$) having a perovskite crystalline structure containing lead and an additional small amount of compound of multiple metallic elements, and made into a solid solution.

Figure 4:
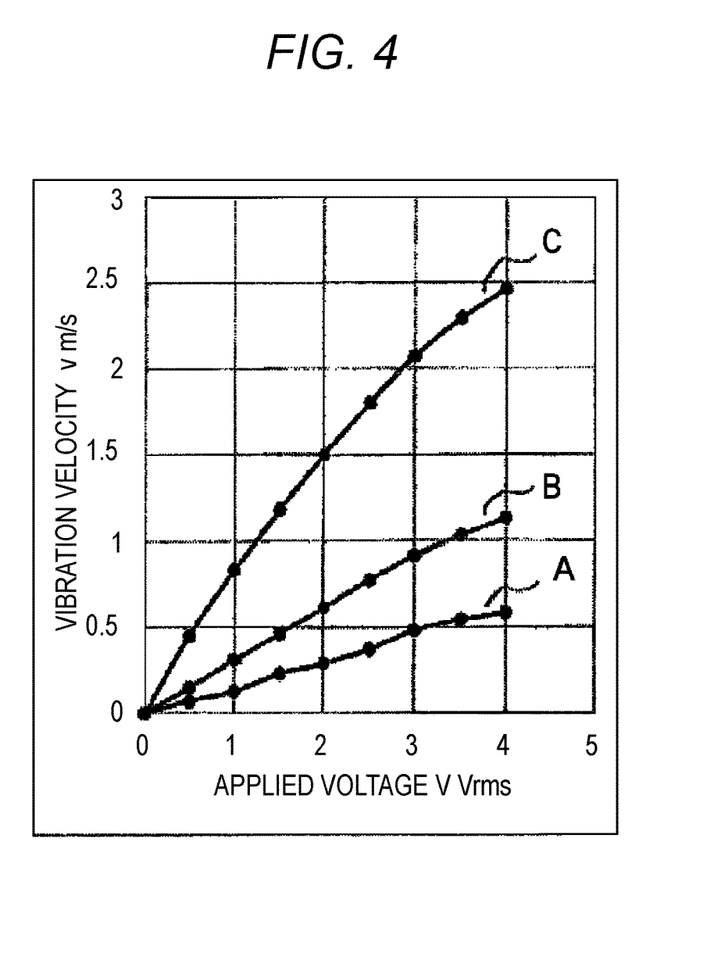
FIG. 4 is a graph showing the relation between applied voltage and vibration velocity that is a result of evaluating the performance of the vibration element.

Vibration elements 1a were made at different sintering temperatures when sintering the electrode layer 5a, the piezoelectric layer 6a, the electrode layer 7a and the substrate 2a together with the ceramic layer 4a simultaneously, and evaluation of the vibration characteristics based on the vibration velocity was evaluated as shown in FIG. 4.

Here, the sintering temperature was lowered as follows.

While the sintering temperature in the related art is 1150° C. (±20° C.), the sintering temperature can be lowered by adding an appropriate amount of copper oxide to the piezoelectric powder that is the piezoelectric material for the piezoelectric layer.

Herein, a vibrator using a piezoelectric material of the related art to which no copper oxide was added, a vibrator using a piezoelectric material of a comparative example to which 0.25% by weight of copper oxide was added, and a vibrator using a piezoelectric material to which the present embodiment is applied to which 0.5% by weight of copper oxide was added were compared as follows.

The vibrators 1a were made by using these piezoelectric materials, respectively, and the vibration velocities were measured by the measurement method shown in FIG. 4 and compared and evaluated as follows.

FIG. 4 is a graph showing the relation between the applied voltage V (effective voltage V rms) and the maximum vibration velocity v (m/s).

In FIG. 4, A represents the vibrator of the related art using the piezoelectric material to which no copper oxide was added and being sintered at a sintering temperature of 1150° C. (±20° C.).

B represents the vibrator of the comparative example using the piezoelectric material to which 0.25% by weight of copper oxide was added and being sintered at a sintering temperature of 1040° C. (±20° C.).

C represents the vibrator to which the present embodiment is applied using the piezoelectric material to which 0.5% by weight of copper oxide was added and being sintered at a sintering temperature of 920° C. (±20° C.).

For all of A, B, and C, silver-palladium alloy powder having a mixing ratio of silver and palladium of the conductive material forming the electrode layer being 70% of silver and 30% of palladium was used.

The vibration velocity v increased as the applied voltage V was raised. The vibration velocity v of C reached higher than 2 m/s when the voltage V was raised to approximately 4 V, while the vibration velocities of A and B were lower than half of 2 m/s.

Specifically, the result showed that the vibration velocity v of the vibrator C sintered at the sintering temperature of 920° C. (±20° C.) was high and that the vibration velocities v of the vibrator A sintered at the sintering temperature of 1150° C. (±20° C.) and the vibrator B sintered at the sintering temperature of 1040° C. (±20° C.) were low.

Since the vibration velocities of the vibration A and the vibration vary widely as a result of a large number of measurements, FIG. 4 shows average representative examples of the vibrator A and the vibrator B.

Although not shown in FIG. 4, when the applied voltage V is further raised to increase input energy, the vibration velocity v of the vibrator C reaches approximately 3 m/s.

Furthermore, when the applied voltage V is raised to higher than 4V to further increase input energy, the vibration velocities v of the vibrators A and B also increase. The slopes of the vibration velocities v of the vibrators A and B with respect to the applied voltage V, however, are smaller than that of the vibrator C, and the heat generation (increase in the temperature) of the vibration element 1a is higher in the vibrators A and B than the vibrator C.

To figure out the cause of the difference in the vibration velocity v between A and B, and C, the vibration element 1a was cut, the section was polished, and the substrate, the ceramic layer, the electrode layers, and the piezoelectric layer were observed under an electron microscope.

While an example in which 0.5% by weight of copper oxide is added is given above, the sintering temperature can be further lowered by further increasing the amount of copper oxide. The piezoelectric property, however, is lowered by further increasing copper oxide, and thus the maximum amount of copper oxide being added with which a piezoelectric property substantially equal to that at the sintering temperature of 1150° C. of the related art is about 0.5% by weight. Thus, the piezoelectric layer can be formed by using a piezoelectric powder to which 0.5% by weight or less copper oxide is added.

As a result of the observation, separations (gaps) between the piezoelectric layer 6a and the electrode layer 5a and between the ceramic layer 4a and the electrode layer 5a was caused in the vibrator A and B.

Furthermore, the separations extended and formed cracks into the piezoelectric layer 6a and into the ceramic layer 4a in some cases. As a result of observing a large number of vibration elements, the number of separations was relatively smaller and the length of the separations was shorter in the vibrator B than in the vibrator A.

The reason for which the vibration velocity does not become higher like the vibrator A and B appears to be that the presence of such separations and cracks increases the energy loss. In addition, it appears that the vibration velocities of the vibrators A and B vary widely when a large number of vibrators are measured because the separations and cracks are caused irregularly.

Conversely, the measurement of the vibration velocity in this manner can be used for evaluation and testing of separations and cracks of the ceramic layers 4a and the piezoelectric elements 3a of vibrators.

Normally, the vibration element 1a is formed by stacking the ceramic layer 4a, the electrode layer 5a, the piezoelectric layer 6a, and the electrode layer 7a on the substrate 2a in this order from the substrate 2a by a screen printing method, which will be described later, and simultaneously sintering the layers. The ceramic layer, the electrode layers, and the piezoelectric layer result in sintering shrinkage.

Shrinkage occurs in the electrode layer 5a made of metal earlier at lower temperatures than in the ceramic layer 4a and the piezoelectric layer 6a, and a dense metal layer is formed at an early stage of sintering (about 200 to 500° C.).

It is expected that sintering of the ceramic layer 4a and the piezoelectric layer 6a is started thereafter, and glass contained in the ceramic layer is melted at substantially the same time, and shrinkage occurs in the ceramic layer 4a and the piezoelectric layer 6a. In this case, glass having a softening point adjusted to 700±50° C. (600 to 750° C.) by changing the content ratio of silicon oxide and boron oxide. As a result, the glass is molten even at a low sintering temperature (940° C. or lower). The fluidized molten glass does not intrude into the piezoelectric layer 6a when the electrode layer 5a is made of completely dense metal.

During sintering, the piezoelectric layer 6a shrinks by about 20% in length. In the meantime, the substrate 2a basically does not shrink but the ceramic layer 4a therebetween serves as relaxation between the shrinkage of the piezoelectric element 3a and the substrate, allowing bonding therebetween.

While the shrinkage of the electrode layer 5a alone is greater than that of the piezoelectric layer 6a, the electrode layer 5a adjacent to the piezoelectric layer 6a and the ceramic layer 4a causes plastic deformation to some extent because the electrode layer 5a is made of metal, and the shrinkage percentage thereof becomes substantially equal to those of the piezoelectric layer 6a and the ceramic layer 4a, causing no separations.

The shrinkage percentage of the piezoelectric material is substantially equal and the piezoelectric property thereof is also substantially equal at different sintering temperature that is the highest temperature during sintering.

The shrinkage of the electrode layer 5a, however, tends to be greater as the sintering temperature is higher. Thus, as the sintering temperature is higher, the electrode layer 5a shrinks more greatly, strain and stress caused between the piezoelectric layer 6a and the electrode layer 5a and between the ceramic layer 4a and the electrode layer 5a become greater and separations become more likely to occur, which is considered to be disadvantageous in bonding.

In fact, as the sintering temperature is higher, the electrode layer 7a at the top surface tends to be separated from the piezoelectric layer 6a, which decreases the electrode area and lowers the piezoelectric property.

As described above, according to the present embodiment, separations do not occur between the ceramic layer 4a and the electrode layer 5a and a robust vibrator/vibrating element 1a having a high vibration velocity can be produced at a sintering temperature of 920° C. (±20° C.), that is, at a sintering temperature of 900° C. or higher but 940° C. or lower.

Furthermore, if the sintering temperature can be lowered, an additional effect of reducing degradation in the material characteristics due to diffusion of molten glass into the substrate and intrusion of molten glass into the piezoelectric layer can be produced. Moreover, sintering at lower temperatures also reduces power consumption of electric furnaces in manufacture and increases the lifetimes of walls of electric furnaces and tools for sintering, which leads to a decrease in the manufacturing cost.

Since noble metal forming the electrode layers is expensive, the mixing ratio of palladium of the conductive in which silver and palladium are mixed is typically adjusted depending on the sintering temperature.

When the sintering temperature is high, the mixing ratio of palladium needs to be increased to increase the melting temperature of the silver-palladium alloy.

Since, however, the sintering temperature in the present embodiment is 900° C. or higher but 940° C. or lower as described above, sintering of 100% by weight of silver without containing palladium is also possible because the melting point of silver is approximately 960° C.

The result of measuring and evaluating the vibration velocity of a vibrator produced by using an electrode material containing only silver to which no palladium is added was substantially the same as that of the vibrator C using 70% by weight of silver and 30% by weight of palladium shown in FIG. 4.

While 100% by weight of silver can be used under normal environment without any problem, some palladium may be added under special conditions such as under a use environment affected by high humidity taking generation of electrical migration into account. In practice, when the additional amount of palladium is maximized taking the effects and the cost into account, a material containing 5% by weight of palladium and 95% by weight of silver is suitable. Thus, the electrode material for a vibrator according to an aspect of the present invention can have a composition of 5% by weight or less of palladium and 95% by weight or more of silver and a composition of 1 to 5% by weight of palladium and 99 to 95% by weight of silver in addition to a composition of 100% by weight of silver can be used. Note that 100% by weight of silver also includes silver containing an amount of impurities that is inevitably contained during manufacture. Since the sintering temperature can be 940° C. or lower, 100% by weight of silver can be used as the electrode material.

For the conductive material powder paste for forming the electrode layers 5a and 7a, a conductive material containing silver or silver and palladium as main components to which 15% by weight of piezoelectric material powder is added is used.

This is because the conductive material powder paste is metal and is thus easily and readily sintered at low temperatures and shrinks greatly. Thus, the piezoelectric powder is mixed into the electrode layer 5a so that the shrinkage due to sintering of the conductive material powder is slightly suppressed to make the ceramic layer 4a and the piezoelectric layer 6a less likely to be separated.

The added piezoelectric material powder may contain the same components or may contain the same main components of lead zirconate and lead titanate ($PbZrO_3$—$PbTiO_3$) as the piezoelectric layer 6a, which can produce the same effects. According to the method described above, the temperature of the piezoelectric material can be lowered to the order of 800° C. The temperature of the piezoelectric material will be further lowered in the future to meet needs for energy saving and requirements in cost. Lower sintering temperatures, however, lower the piezoelectric property, and it is very difficult at present to obtain the piezoelectric property equal to that of the piezoelectric material sintered at a sintering temperature of 1150° C., for example. Thus, sintering of the piezoelectric material can be performed at 940° C. or lower, and more preferably at a temperature of 800° C. or higher but 940° C. or lower. The sintering temperature is still more preferably 900° C. or higher but 940° C. or lower. If a lower piezoelectric property is not a practical problem (problem in use), a piezoelectric material at a lower temperature in the order of 800° C. or lower can be used. In such a case, a conductive material containing 100% of silver with the sintering temperature of 940° C. or lower can be used similarly to the present embodiment.

Second Embodiment

Figures 5A, 5B:
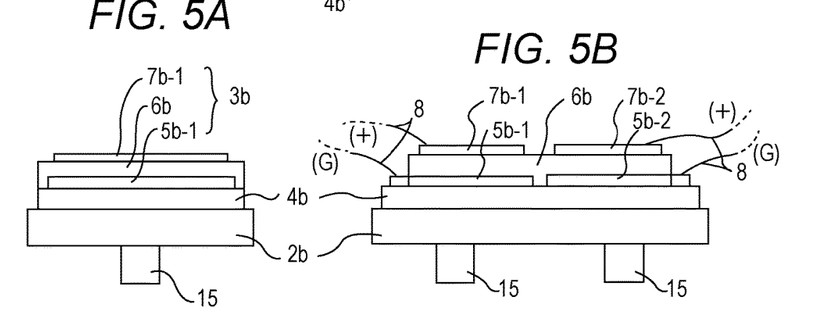
FIGS. 5A, 5B, and 5C are a front view, a side view, and a plan view, respectively, explaining an example structure of a vibration element.

An example structure of a vibration element according to a second embodiment different from that of the first embodiment will be described with reference to FIGS. 5A to 5C. FIG. 5A is a front view, FIG. 5B is a side view, and FIG. 5C is a plan view.

Figure 5C:
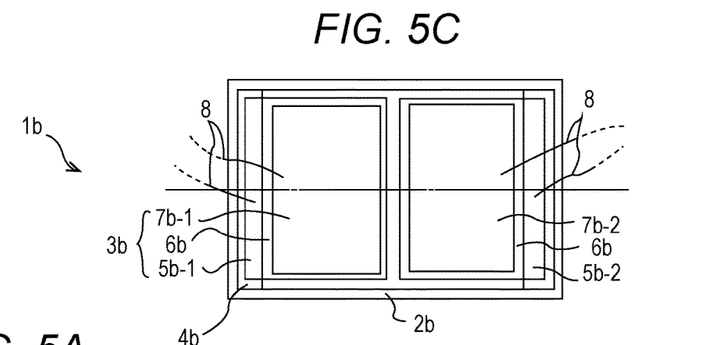

The vibration element 1b illustrated in FIGS. 5A to 5C is expected to be applied to a linearly-driving, vibration-type driving device presented as an example of the related art.

The manufacturing method, the substrate, the piezoelectric layer, the electrode layers, and the ceramic layer used here are basically the same as those in the first embodiment, but the piezoelectric layer is made to have a multilayered structure.

The vibration element 1b has a plate-like substrate 2b and a piezoelectric element 3b, and is provided with a ceramic layer 4b therebetween made of ceramics containing glass powder.

The substrate 2b and the piezoelectric element 3b with the ceramic layer 4b therebetween are fixed and integrated by simultaneous sintering as will be described later.

Specifically, the piezoelectric element 3b that functions as a vibration energy source is fixed and integrated to the substrate 2b that is vibrated by the vibration energy of the piezoelectric element 3b with the ceramic layer 4b therebetween. In the piezoelectric element 3b that functions as the vibration element 1b, electrode layers 5b-1 and 5b-2, a piezoelectric layer 6b, and electrode layers 7b-1 and 7b-2 are stacked in this order.

The electrode layer 5b is divided into two electrode layers 5b-1 and 5b-2 and is in an insulating state. Similarly, the electrode layer 7b is divided into two electrode layers 7b-1 and 7b-2 and is in an insulating state. The two electrode layers 5b-1 and 5b-2 and the two electrode layers 7b-1 and 7b-2 are opposed to one another with the piezoelectric layer 6b therebetween.

Furthermore, electrical continuity with an external power source and poling are achieved by fixing conductive wires 8 onto the surfaces of the two electrode layers 5b-1 and 5b-2 and the two electrode layers 7b-1 and 7b-2 with a conductive paste or solder.

Subsequently, basically in the same manner as in the first embodiment, a voltage is applied across the electrode layers 5b-1 and 7b-1 to be grounded (G) and the electrode layers 5b-1 and 7b-1 to be positive (+) via the conductive wires 8 to perform poling on the portions (piezoelectric active portions) of the piezoelectric layer 6b where the electrode layers are opposed.

The conditions for poling are that a predetermined DC voltage (corresponding to approximately 1 V/μm per thickness of the piezoelectric layer 6b) is applied across the ground (G) and the positive (+) on a hot plate heated to a high temperature of 170 to 200° C., and poling is performed for about 30 minutes.

The portions between the piezoelectric layers subjected to poling are layers that cause displacement as piezoelectric active portions, and the piezoelectric property of the layers relates directly to the vibration characteristics of the vibration plate and the performance of the vibration-type driving device.

The substrate 2b has a length of 9 mm, a width of mm, and a thickness of 0.25 mm. Two protrusions 15 having a height of 0.25 mm are formed on a surface of the substrate 2b opposite to the surface on which the piezoelectric element 3b is provided by removing the part other than the protrusions 15 by blast processing.

The piezoelectric element 3b includes the electrode layers 5b-1 and 5b-2, the piezoelectric layer 6b, and the electrode layers 7b-1 and 7b-2.

The ceramic layer 4b has a length of 8.5 mm, a breadth of 5.5 mm, and a thickness of 10 μm. The electrode layers 5b-1 and 5b-2 each have a length of 3.3 mm, a breadth of 5.5 mm, and a thickness of 6 μm, and have a portion of 0.4 mm in width where no electrode is formed in the longitudinal direction at the center.

The piezoelectric layer 6b has a length of 6 mm, a breadth of 5.5 mm, and a thickness of 10 μm. The electrode layers 7b-1 and 7b-2 each have a length of 2.2 mm, a breadth of 4.8 mm, and a thickness of 3 μm, and have a portion of 0.6 mm in width where no electrode is formed in the longitudinal direction at the center.

In light of the result of the first embodiment, the electrode layers 5b-1 and 5b-2 are larger than the electrode layers 7b-1 and 7b-2 by about 0.2 mm in the longitudinal direction in plan view of FIG. 5C. This is to prevent degradation in the piezoelectric property even when molten glass intrudes into the piezoelectric active portions of the piezoelectric layer. The two electrode layers 5b-1 and 7b-1 and the two electrode layers 5b-2 and 7b-2 are subjected to poling in advance and two high-frequency voltages having different phases are then supplied across the electrode layers from the external power source for controlling vibration of the piezoelectric element 3b.

The high-frequency voltages cause the piezoelectric active portions of the piezoelectric layer 6b facing the two electrode layers 5b-1 and 7b-1 and the two electrode layers 5b-2 and 7b-2 to stretch, the stretching is transmitted to the substrate 2b via the ceramic layer 4b, and the vibration element 1b as a whole vibrates.

Figure 6:
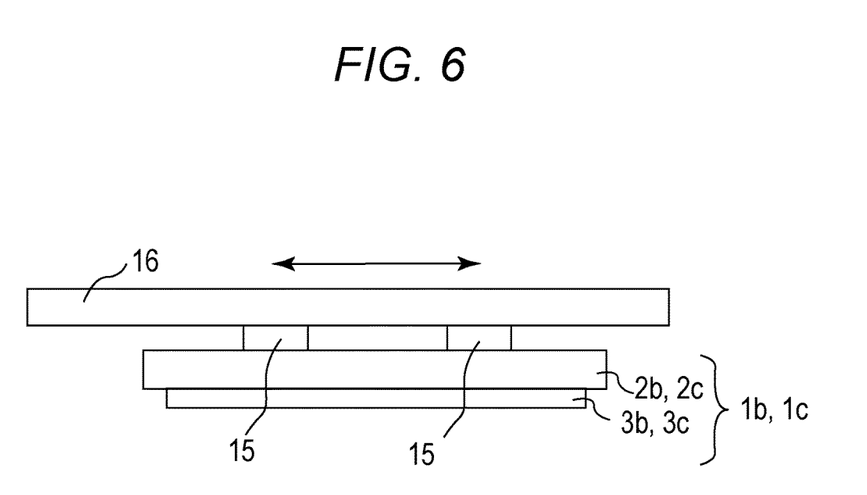
FIG. 6 is a diagram illustrating a linear, vibration-type driving device in which a vibration element is integrated.

FIG. 6 is a diagram illustrating a structure of a linear, vibration-type driving device in which the vibration element 1b of the second embodiment is integrated.

The principle of linear drive is the same as that of the related art.

A linear slider 16 comes in pressure contact with the protrusions 15. Then, the vibration element 1b is vibrated by the vibration of the piezoelectric element 3b, and excited elliptical movement of the protrusions 15 causes reciprocating movement in the direction of the arrow of the linear slider 16 that is a driven element. The protrusions 15 are also made of alumina similarly to the vibration plate 1b, and have abrasion resistance.

In the embodiments described above, the electric continuity between the electrode layers and the external power source is achieved by using the conductive wires 8. Alternatively, the electric continuity between the electrode layers and the external power source may be achieved by using a flexible circuit board instead of the conductive wires 8.

The screen printing method for forming layers on a substrate facilitates formation of a thinner layer having a thickness with high accuracy as compared to stacking using the green sheets described above, and can also control the coating positions with high accuracy, eliminating the necessity of machine processing after sintering.

Furthermore, the manufacturing equipment is inexpensive, resulting in that the manufacturing cost is much lower than that of the piezoelectric elements of the related art.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-023670, filed Feb. 8, 2013, which is hereby incorporated by reference herein in its entirety.

What is claimed is:

1. A vibration element comprising:
   a substrate;
   a ceramic layer containing glass and provided on the substrate; and
   a piezoelectric element provided on the ceramic layer, wherein the piezoelectric element includes an electrode layer and a piezoelectric layer, wherein
   the glass has a melting temperature of 600 to 750° C.

2. The vibration element according to claim 1, wherein the ceramic layer contains the same main components as the piezoelectric layer.

3. The vibration element according to claim 1, wherein the piezoelectric layer contains lead zirconate and lead titanate as main components.

4. The vibration element according to claim 1, wherein the vibration element vibrates the substrate by vibration energy of the piezoelectric element to output vibration energy.

5. A vibration-type driving device comprising the vibration element according to claim 1 as a driving power source.

6. A vibration element comprising:
   a substrate;
   a ceramic layer containing glass and provided on the substrate; and
   a piezoelectric element provided on the ceramic layer, wherein the piezoelectric element includes an electrode layer and a piezoelectric layer, wherein
   the electrode layer in contact with the ceramic layer contains silver as a main component to which 5% by weight or less of palladium is added.

7. A vibration element comprising:
   a substrate;
   a ceramic layer containing glass and provided on the substrate; and
   a piezoelectric element provided on the ceramic layer, wherein the piezoelectric element includes an electrode layer and a piezoelectric layer, wherein
   the glass contains silicon oxide and boron oxide as main components, and
   the glass is contained in the ceramic layer from 0.5% by weight or more to 10% by weight or less.

8. A vibration element comprising:
   a substrate;
   a ceramic layer containing glass and provided on the substrate; and a piezoelectric element provided on the ceramic layer, wherein the piezoelectric element includes an electrode layer and a piezoelectric layer, wherein the piezoelectric layer contains 0.5% by weight or less of copper oxide.

9. The vibration element according to claim 8, wherein the glass has a melting temperature of 600 to 750° C.

10. The vibration element according to claim 8, wherein the electrode layer in contact with the ceramic layer contains silver as a main component to which 5% by weight or less of palladium is added.

11. The vibration element according to claim 8, wherein
the glass contains silicon oxide and boron oxide as main components, and the glass is contained in the ceramic layer from 0.5% by weight or more to 10% by weight or less.

12. The vibration element according to claim 8, wherein the ceramic layer contains the same main components as the piezoelectric layer.

13. The vibration element according to claim 8, wherein the piezoelectric layer contains lead zirconate and lead titanate as main components.

14. The vibration element according to claim 8, wherein the vibration element vibrates the substrate by vibration energy of the piezoelectric element to output vibration energy.

15. A vibration-type driving device comprising the vibration element according to claim 8 as a driving power source.

* * * * *